(12) United States Patent
Hess, Jr. et al.

(10) Patent No.: US 6,185,232 B1
(45) Date of Patent: Feb. 6, 2001

(54) WAVELENGTH MODULATED LASER FOR MINIMIZING EFFECTS OF RAYLEIGH BACKSCATTERING

(75) Inventors: Doren W. Hess, Jr., Norcross; Rezin E. Pidgeon, Jr., Atlanta, both of GA (US)

(73) Assignee: Scientific-Atlanta, Inc., Norcross, GA (US)

( * ) Notice: Under 35 U.S.C. 154(b), the term of this patent shall be extended for 0 days.

(21) Appl. No.: 09/107,428

(22) Filed: Jun. 30, 1998

(51) Int. Cl.[7] ........................................ H01S 3/10
(52) U.S. Cl. .................. 372/28; 372/28; 372/96; 372/20; 372/26; 372/32; 372/102; 372/46; 372/3; 372/5; 372/34; 372/43; 372/36
(58) Field of Search .................. 372/28, 96, 20, 372/26, 32, 102, 46, 3, 5, 34, 43, 36

(56) References Cited

U.S. PATENT DOCUMENTS

| | | | |
|---|---|---|---|
| 4,835,779 | * 5/1989 | Liou | 372/26 |
| 5,325,382 | * 6/1994 | Emura et al. | 372/26 |
| 5,473,625 | 12/1995 | Hansen et al. | |
| 5,570,439 | * 10/1996 | Ido et al. | 385/37 |
| 5,808,314 | * 9/1998 | Nakajima et al. | 257/17 |
| 5,991,061 | * 11/1999 | Adams et al. | 359/188 |

OTHER PUBLICATIONS

P.B. Hansen, L. Eskildsen, U. Koren, B.I. Miller, M.G. Young, K.J. Dryer, "SBS Suppression using a Temperature Wavelength–modulated Laser Diode with Low Residual AM", Optical Fiber Communication OFC '96 Conference, vol. 2, 1996 Technical Digest Series, Conference Edition, Feb. 25–Mar. 1, 1996, pp. 302–303.

* cited by examiner

Primary Examiner—Frank G. Font
Assistant Examiner—Delma R. Flores Ruiz
(74) Attorney, Agent, or Firm—Kelly A. Gardner; Kenneth M. Massaroni; Hubert J. Barnhardt III

(57) ABSTRACT

An optical transmitter (405) includes a distributed feedback semiconductor laser (100) operated in a linear regime below a threshold associated with stimulated Brillouin scattering to generate an optical signal. A resistor (125) or other heater is physically coupled to the semiconductor laser (100), and a modulated current source (120) drives the resistor (125) with a triangle waveform (300), thereby varying an optical wavelength of the optical signal such that the optical signal and a double Rayleigh backscattered signal are characterized, at the optical receiver (410), by different optical frequencies. As a result, interference generated by Rayleigh backscattering is minimized at the optical receiver (410).

24 Claims, 2 Drawing Sheets

WAVELENGTH MODULATED LASER FOR MINIMIZING EFFECTS OF RAYLEIGH BACKSCATTERING

FIELD OF THE INVENTION

This invention relates generally to lasers, and more specifically to communication devices using semiconductor lasers for optical communication.

BACKGROUND OF THE INVENTION

Cable television systems typically include a headend section for receiving satellite signals and demodulating the signals to baseband. The baseband signal is then converted to an optical signal for transmission from the headend section over fiber optic cable. Optical transmitters are distributed throughout the cable system for splitting and transmitting optical signals, and optical receivers are provided for receiving the optical signals and converting them to radio frequency (RF) signals that are further transmitted along branches of the system over coaxial cable rather than fiber optic cable. Taps are situated along the coaxial cable to tap off the cable signals to subscribers of the system.

In conventional communication systems, such as cable television systems, the fiber optic cable is characterized by small material variations or inhomogeneities that can cause reflection of the optical signal in the reverse direction, i.e., a Rayleigh backscattered signal. The backscattered signal then encounters further fiber variations which cause generation of yet another reflected signal in the forward direction. This signal is referred to as a double Rayleigh backscattered signal. As a result, two signals, the initial forward optical signal and the double Rayleigh backscattered signal, travel in the forward direction and are received by the optical receiver. This generates interference and intensity beats in the receiver, which can cause erroneous demodulation.

Thus, what is needed is a way to reduce interference generated by Rayleigh backscattering in an optical communication system.

DETAILED DESCRIPTION OF A PREFERRED EMBODIMENT

Figure 1:
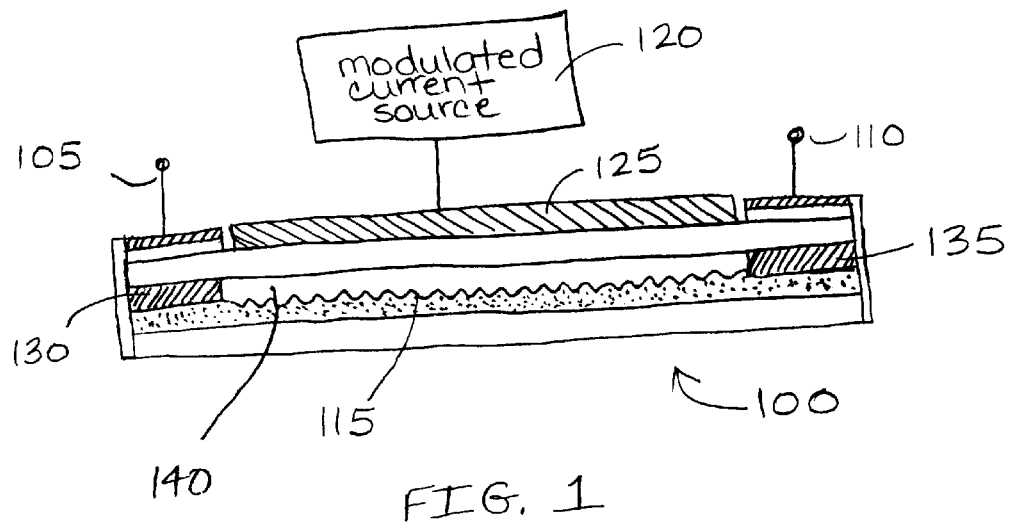
FIG. 1 is side view of a distributed feedback laser that is wavelength modulated in accordance with the present invention.

FIG. 1 is a side view of a semiconductor laser 100, such as a distributed feedback (DFB) laser diode, that is wavelength modulated by application of heat to minimize the effect of Rayleigh backscattering in a communication system, such as a cable television system, including the laser 100. Preferably, the laser 100 and corresponding thermal modulation apparatus is included within an optical transmitter (not shown) for transmitting optical signals generated by the laser 100.

The laser 100 itself is configured similar to conventional DFB lasers and includes a first terminal 105 for receiving a direct current (DC) bias current and a second terminal 110 for receiving data, preferably in the form of a radio frequency (RF) signal. Left and right facets 130, 135 partially enclose a cavity 140 that is bounded from beneath by a fiber grating 115 extending the length of the cavity 140. The cavity 140 can be, for instance, approximately 300 micrometers in length and about 1—3 micrometers in width.

In accordance with the present invention, a heater 125 is physically coupled to a surface of the semiconductor laser 100 for heating the semiconductor material, thereby varying the optical wavelength of the optical signal that is output by the laser 100. The heater 125 can be, for example, a chip resistor having a ceramic substrate plated with a resistive material, e.g., titanium and/or platinum. The resistor/heater 125 can substantially run the length of the laser 100, as shown. Alternatively, a smaller heater 125 could be centrally located on the surface of the laser 100 or even skewed to one side or the other.

The resistor is electrically coupled to a modulated current source 120 for driving the resistor with a continuous signal, such as a sinusoidal, sawtooth, or triangular waveform. Preferably, the current source 120 produces a triangular waveform, as will be explained in greater detail below.

The signal generated by the modulated current source 120 causes the resistor to produce varying amounts of heat over time, resulting in the continuous changing of temperature within the cavity 140. As a result, the optical wavelength of the emitted optical signal varies with time. This conveniently minimizes the effect of Rayleigh backscattering upon signals received by an optical receiver (not shown) within the communication system.

Figure 2:
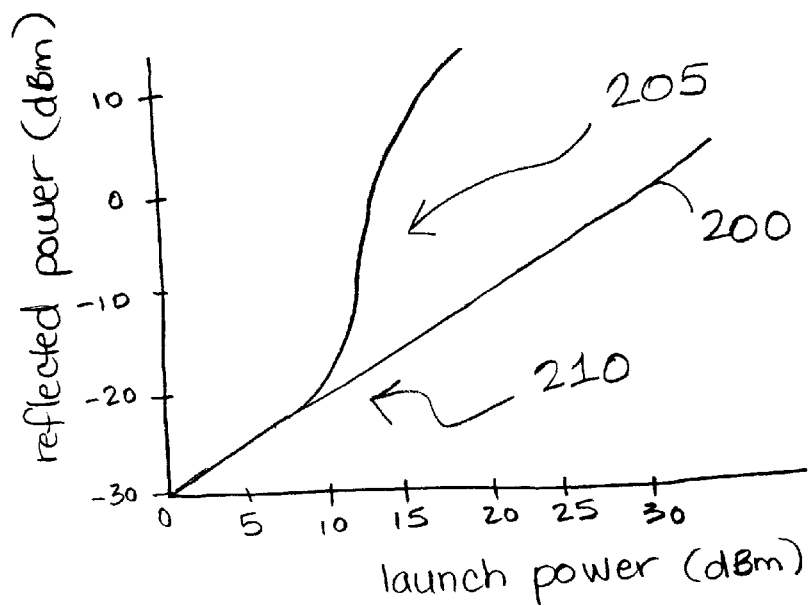
FIG. 2 is a signal diagram depicting a mode of operation in which the laser of FIG. 1 can operate in accordance with the present invention.

Referring next to FIG. 2, a signal diagram of reflected power versus launch power of the laser 100 is shown. Region 205 above line 200 depicts a region in which the launch power is great enough to cause the onset of problematic stimulated Brillouin scattering (SBS). Region 210 represents an operational mode in which the laser 100 is operated in the linear regime below the SBS threshold 200 (*Doren and Rezin, does this terminology sound correct?*). In lower power applications, such as 1310 nanometer laser applications for use in cable television systems, the effects of SBS are minimal. However, even in lower power applications, Rayleigh backscattering can create problems in the communication system. As a result, the laser 100 according to the present invention is particularly useful for minimizing effects of Rayleigh backscattering in lower power applications in which the laser is operated below the SBS threshold, i.e., at powers low enough so that SBS has not become problematic, although problems associated with Rayleigh backscattering can be reduced above the SBS threshold as well.

Figure 3:
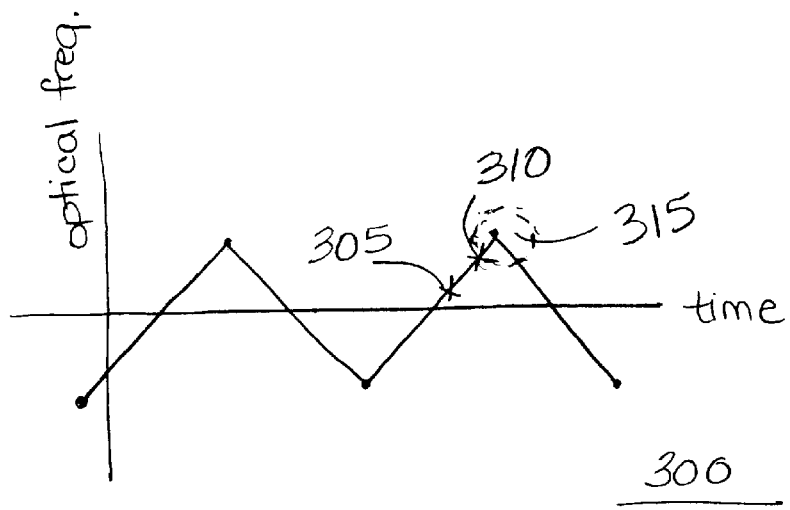
FIG. 3 is a signal diagram depicting a modulating waveform for modulating the laser of FIG. 1 in accordance with the present invention.

Referring next to FIG. 3, a triangular waveform 300 that can be generated by the modulated current source 120 (FIG. 1) is illustrated. As the amplitude of the waveform 300 changes, the current with which the resistor/heater is driven also changes, thereby varying the temperature of the laser 100. It will be appreciated that variations in the amplitude of the waveform 300 therefore vary the optical wavelength of the optical signal produced by the laser 100. For instance, the optical wavelength of the laser output is different when the resistor is driven at time 305 than when driven at time 310.

Figure 4:
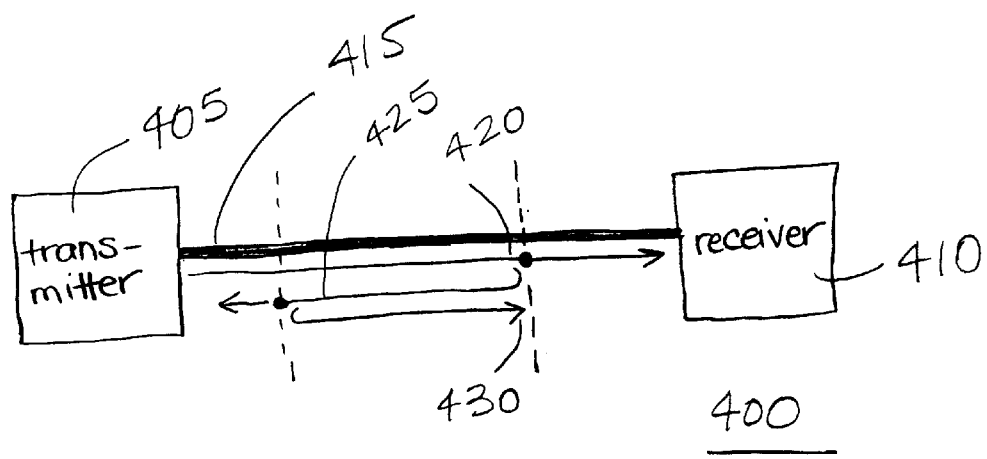
FIG. 4 is a side view of a communication system including a forward signal, a Rayleigh backscattered signal, and a double Rayleigh backscattered signal in accordance with the present invention.

FIG. 4 is a diagram illustrating optical signals that are processed within an optical communication system, such as a cable television system 400 including an optical transmitter 405, an optical receiver 410, and a communication medium 415, such as a fiber optic cable, coupling the receiver 410 and the transmitter 405. The optical transmitter 405 includes the wavelength modulated laser 100 that generates the forward optical signal 420, which essentially has a different optical wavelength at each point in time. Due to material variations in the fiber and other inhomogeneities, the forward signal 420 can be reflected to generate a reflected signal 425 in the reverse direction, i.e., a Rayleigh backscattered signal 425. Further variations and inhomogeneities in the fiber can result in this reverse signal being reflected yet again to generate a second forward optical signal, i.e., a double Rayleigh backscattered signal 430. By the time that this double Rayleigh backscattered signal 430 reaches the optical receiver 410, the optical wavelength of the original forward signal 420 will have been varied such that the forward optical signal 420 and the double Rayleigh backscattered signal 430 have different optical wavelengths, eliminating the intensity beats in the receiver 410 and the interference that can result when optical signals are generated using prior art methods.

In accordance with the present invention, the current source 120 (FIG. 1) can drive the heater 125 with any continuous waveform. In the context of Rayleigh backscattering, however, generation of a triangle waveform 300 (FIG. 3) by the current source 120 is preferred because the double Rayleigh backscattered signal 430 follows the forward optical signal 420 relatively closely in time. As a result, the gently sloping peaks and valleys of a sinusoidal signal increase the risk that the optical wavelength of the double Rayleigh backscattered signal 430 will be repeated in the forward optical signal 420. The sharper peaks and valleys of the triangular waveform 300, on the other hand, create a much smaller region 315 (FIG. 3) in which this could occur.

In summary, the communication system as described above includes an optical transmitter having a wavelength modulated semiconductor laser, the cavity of which is exposed to variations in temperature over time to produce an output signal having an optical wavelength that varies with time. The forward optical signal produced by the laser is received by an optical receiver coupled to the transmitter by a communication medium such as fiber optic cable. Inhomogeneities in the fiber of the cable can create reflections, known as Rayleigh backscattering, that can result in a second, reflected optical signal in the forward direction, and this reflected forward signal is also received by the optical receiver.

In prior art systems, the optical wavelength of the initial forward signal is equivalent to the optical wavelength of the reflected, forward signal, which causes interference at the receiver. Conversely, the communication system according to the present invention provides, as a result of the wavelength modulated laser, an initial forward signal that has an optical wavelength different from that of any reflected, forward signals. Therefore, reception and processing of the optical signals provided to the optical receiver can be performed in a more reliable manner.

What is claimed is:

1. A device for generating an optical signal, comprising:
   a semiconductor laser;
   a heater physically coupled to the semiconductor laser; and
   a modulated current source coupled to the heater for modulating a temperature of the heater, thereby varying an optical wavelength of the optical signal such that the optical signal and a double Rayleigh backscattered signal associated with the optical signal are characterized by different optical frequencies, wherein the modulated current source generates a triangle waveform.

2. The device of claim 1, wherein the semiconductor laser is operated in a linear regime below a threshold associated with stimulated Brillouin scattering.

3. The device of claim 1, wherein the semiconductor laser comprises a distributed feedback laser diode.

4. The device of claim 1, wherein the heater comprises a resistor electrically coupled to the modulated current source.

5. A device for generating an optical signal, comprising:
   a semiconductor laser;
   a heater physically coupled to the semiconductor laser; and
   a modulated current source coupled to the heater for modulating a temperature of the heater, thereby varying an optical wavelength of the optical signal such that the optical signal and a double Rayleigh backscattered signal associated with the optical signal are characterized by different optical frequencies, wherein the optical signal has an optical frequency of approximately 1310 nanometers.

6. A device for generating an optical signal, comprising:
   a semiconductor laser, comprising a cavity having a grating with a length of approximately 300 micrometers and a width of approximately 1–3 micrometers;
   a heater physically coupled to the semiconductor laser; and
   a modulated current source coupled to the heater for modulating a temperature of the heater, thereby varying an optical wavelength of the optical signal such that the optical signal and a double Rayleigh backscattered signal associated with the optical signal are characterized by different optical frequencies.

7. An optical transmitter for generating an optical signal, comprising:
   a semiconductor laser operated in a linear regime below a threshold associated with stimulated Brillouin scattering;
   a heater physically coupled to the semiconductor laser; and
   a modulated current source coupled to the heater for modulating a temperature of the heater, thereby varying an optical wavelength of the optical signal such that the optical signal and a double Rayleigh backscattered signal associated with the optical signal are characterized by different optical frequencies, wherein the modulated current source generates a triangle waveform.

8. The optical transmitter of claim 7, wherein the semiconductor laser comprises a distributed feedback laser diode.

9. The optical transmitter of claim 7, wherein the heater comprises a resistor electrically coupled to the modulated current source.

10. An optical transmitter for generating an optical signal, comprising:
    a semiconductor laser operated in a linear regime below a threshold associated with stimulated Brillouin scattering;
    a heater physically coupled to the semiconductor laser; and a modulated current source coupled to the heater for modulating a temperature of the heater, thereby varying an optical wavelength of the optical signal such that the optical signal and a double Rayleigh backscattered signal associated with the optical signal are characterized by different optical frequencies, wherein the optical signal has an optical frequency of approximately 1310 nanometers.

11. An optical transmitter for generating an optical signal, comprising:

a semiconductor laser operated in a linear regime below a threshold associated with stimulated Brillouin scattering, wherein the semiconductor laser comprises a cavity having a grating with a length of approximately 300 micrometers and a width of approximately 1–3 micrometers;

a heater physically coupled to the semiconductor laser; and a modulated current source coupled to the heater for modulating a temperature of the heater, thereby varying an optical wavelength of the optical signal such that the optical signal and a double Rayleigh backscattered signal associated with the optical signal are characterized by different optical frequencies.

12. A communication system for transmitting optical signals, the communication system comprising:

an optical transmitter, including:
a semiconductor laser for generating an optical signal;
a heater physically coupled to the semiconductor laser; and
a modulated current source coupled to the heater for modulating a temperature of the heater, thereby varying an optical wavelength of the optical signal such that the optical signal and a double Rayleigh backscattered signal associated with the optical signal are characterized by different optical frequencies; and an optical receiver for receiving the optical signal and the double Rayleigh backscattered signal at the different optical frequencies.

13. The communication system of claim 12, further comprising:
a communication medium coupling the optical transmitter to the optical receiver.

14. The communication system of claim 12, wherein the semiconductor laser is operated in a linear regime below a threshold associated with stimulated Brillouin scattering.

15. The communication system of claim 12, wherein the modulated current source generates a triangle waveform.

16. The communication system of claim 12, wherein the optical signal has an optical frequency of approximately 1310 nanometers.

17. The communication system of claim 12, wherein the semiconductor laser comprises a distributed feedback laser diode.

18. A communication system for transmitting optical signal, the communication system comprising:

an optical transmitter, including:
a semiconductor laser operated in a linear regime below a threshold associated with stimulated Brillouin scattering to generate an optical signal;
a resistor physically coupled to the semiconductor laser;
a modulated current source electrically coupled to the resistor for modulating a temperature thereof by driving the resistor with a triangle waveform, thereby varying an optical wavelength of the optical signal such that the optical signal and a double Rayleigh backscattered signal associated with the optical signal are characterized by different optical frequencies;

an optical receiver for receiving the optical signal and the double Rayleigh backscattered signal at the different optical frequencies; and a communication medium coupling the optical transmitter to the optical receiver, wherein the double Rayleigh backscattered signal is a result of reflections of the optical signal caused by inhomogeneities in the communication medium.

19. The device of claim 5, wherein the semiconductor laser is operated in a linear regime below a threshold associated with stimulated Brillouin scattering.

20. The device of claim 5, wherein the semiconductor laser comprises a distributed feedback laser diode.

21. The device of claim 5, wherein the heater comprises a resistor electrically coupled to the modulated current source.

22. The device of claim 6, wherein the semiconductor laser is operated in a linear regime below a threshold associated with stimulated Brillouin scattering.

23. The device of claim 6, wherein the semiconductor laser comprises a distributed feedback laser diode.

24. The device of claim 6, wherein the heater comprises a resistor electrically coupled to the modulated current source.

* * * * *

UNITED STATES PATENT AND TRADEMARK OFFICE
CERTIFICATE OF CORRECTION

PATENT   : 6,185,232 B1
DATED    : February 6, 2001
INVENTOR(S): HESS ET AL

It is certified that error appears in the above-identified patent and that said Letters Patent is hereby corrected as shown below:

Column 2, Line 42, delete "(Doren and Rezin, does this terminology sound correct?)"

Signed and Sealed this

Fifteenth Day of May, 2001

Attest:

NICHOLAS P. GODICI

Attesting Officer

Acting Director of the United States Patent and Trademark Office